United States Patent [19]

Tolliver et al.

[11] 3,887,733

[45] June 3, 1975

[54] DOPED OXIDE REFLOW PROCESS

[75] Inventors: Donald L. Tolliver, Phoenix; William E. Armstrong, Tempe, both of Ariz.

[73] Assignee: Motorola, Inc., Chicago, Ill.

[22] Filed: Apr. 24, 1974

[21] Appl. No.: 463,631

[52] U.S. Cl. .................. 427/444; 148/1.5; 148/187; 357/73; 427/86

[51] Int. Cl. .................. B44d 1/16

[58] Field of Search ............. 148/1.5, 187; 117/201, 117/212, 215, 217; 156/17; 357/73

[56] References Cited

UNITED STATES PATENTS

| | | | |
|---|---|---|---|
| 3,476,619 | 11/1969 | Tolliver | 148/187 |
| 3,756,876 | 9/1973 | Brown et al. | 148/187 X |
| 3,825,442 | 7/1974 | Moore | 156/17 X |

*Primary Examiner*—L. Dewayne Rutledge
*Assistant Examiner*—J. M. Davis
*Attorney, Agent, or Firm*—Vincent J. Rauner; Willis E. Higgins

[57] ABSTRACT

The shape of a doped oxide (e.g.) phosphorous doped oxide layer on a substrate may be altered by contacting the doped oxide with a source of hydroxyl ions, such as water, and heating the doped oxide to at least its softening temperature while in contact with the source of hydroxyl ions. The presence of the hydroxyl ions during this anneal reduces time required for the anneal by a factor of three or four for a given alteration of shape. This process is particularly useful for assuring proper oxide coverage over stepped structures, and correction of surface irregularities common in integrated circuits.

7 Claims, 3 Drawing Figures

DOPED OXIDE REFLOW PROCESS

FIELD OF THE INVENTION:

This invention relates to a process for altering the shape of an oxide layer on a substrate. More particularly, it relates to a process in which the shape of a doped oxide layer on a substrate is altered by annealing, usually for the purpose of assuring a continuous oxide layer of relatively constant thickness. More especially, the invention relates to such a process in which the annealing conditions are changed to give a process of increased acceptability in the fabrication of integrated circuits and similar structures.

DESCRIPTION OF THE PRIOR ART:

It has been recognized for quite some time that an oxide film deposited on a substrate may be annealed by heating it above its softening point in order to cause it to flow slightly and therefore form a relatively constant thickness over the substrate. It has further been recognized that such oxide films can be doped with, e.g., phosphorous oxide in order to lower the softening point of the oxide, thus allowing a lower temperature to be employed for the anneal. Such an annealing process has achieved fairly wide acceptance for assuring the integrity of oxide films deposited on substrates, particularly in the fabrication of integrated circuits.

In the fabrication of integrated circuits, it is common to deposit an oxide film after fabrication of the integrated circuit in and on the substrate, such as a silicon wafer, has been essentially completed. Whenever partially fabricated integrated circuits are subjected to further heating, their characteristics are changed, such as by altering the shape and concentration profile of diffusions forming elements of the circuit, altering surface properties of a silicon or other semiconductor substrate in which the circuits are formed, and the like.

Thus, while annealing of oxide layers on semiconductor substrates is recognized to be both necessary and desirable in the fabrication of integrated circuits, there remains a need to reduce the effect such annealing operations have on other elements of the integrated circuit than the oxide itself.

SUMMARY OF THE INVENTION:

Accordingly, it is an object of this invention to provide a method for obtaining oxide layers of relatively constant thickness on a substrate by annealing while maintaining integrity of the substrate.

It is another object of the invention to materially reduce the time and or temperature required for annealing a doped oxide layer on a substrate to alter its shape to a given extent.

It is still another object of the invention to provide a method for reflowing a doped oxide layer in which the effect of the reflowing operation on other elements of an integrated circuit including the doped oxide layer is minimized.

The attainment of these and related objects may be achieved through use of the novel doped oxide annealing process herein disclosed. This process alters the shape of the doped oxide on its substrate by causing it to reflow, and involves contacting the doped oxide with a source of hydroxyl ions, such as water. The doped oxide is then heated to at least its softening temperature while in contact with the source of hydroxyl ions.

An oxide to be annealed in accordance with this invention may be doped with essentially any dopant that will combine chemically with the hydroxyl ions to promote flow of the oxide when heated. Since this process is of primary value in the fabrication of integrated circuits and other semiconductor devices, the dopant preferably employed is one used to alter the conductivity of silicon or other semiconductor materials. Typical examples of such dopants are phosphorous, arsenic, and boron. The preferred dopant for practice of this invention is phosphorous in its oxide form. In the case of silicon oxide, the preferred oxide for practice of this invention, the dopant should be present in an amount of from about $1 \times 10^{20}$ to $1 \times 10^{21}$ atoms per cubic centimeter, as determined by solid state diffusion, an art recognized technique for measuring dopants in oxide films. In the case of the preferred phosphorous dopant,, a level of about 6 to $7 \times 10^{20}$ atoms per cubic centimeter of dopant is best, which corresponds to about 8 weight percent phosphorous in the silicon oxide film.

In practice, substrates having doped oxides to be reflowed in accordance with this invention are positioned in a suitable annealing chamber, such as an open tube with a diameter of about 110 mm; when annealing doped oxide layers on 3 inch diameter semiconductor wafers. The source of hydroxyl ions is then supplied to the chamber. Suitable examples of such sources include steam, hydrogen and oxygen reacted in situ to form water, wet oxygen (i.e., oxygen that has been bubbled through water at 95°C), wet nitrogen, and the like.

The preferred source of hydroxyl ions is water formed in situ by the reaction of hydrogen and oxygen, which allows better control of process uniformity in the chamber. Above a certain minimum, the amount of water present is not critical. In the preferred mode of forming the water in situ, the hydrogen and oxygen are bled into an open tube chamber at flow rates of from about 2500 cc per minute to about 3500 cc per minute and 1200 cc per minute to about 1800 cc per minute, respectively. These flow rates are determined by what is necessary to maintain the open tube free from outside contamination, rather than what is required for reaction with the doped oxide.

The doped oxide is heated at least to its softening point in the presence of the source of hydroxyl ions. In the case of the preferred phosphorous oxide doped silicon oxide, a temperature of from about 1000°C to about 1100°C is satisfactory for this purpose, with a temperature of about 1050°C being preferred. The length of time that the doped oxide should contact the source of hydroxyl ions at the elevated temperature varies considerably, depending on the structure of the oxide. A low density oxide, such as is formed from silane and oxygen at a temperature of about 375 to 425°C will take less time to reflow than a higher density oxide, such as is formed by radio frequency sputtering. In addition to these oxides, suitable silicon oxides for practice of this invention may be formed from tetraethylorthosilicate and oxygen at about 700° to 750°C; silicon tetrachloride, $CO_2$, $NO_2$ or $N_2O$, $O_2$ and $H_2$, dichlorosilane and $N_2O$ at about 900° to 1100°C, and the like. Corresponding oxides of other materials than silicon may be utilized as well. These oxides may be doped with phosphine, diborane, arsine, and the like, which react to form the dopants as their corresponding oxides in the silicon or other base oxide.

In addition to reflowing the doped oxide, the process of this invention increases its density, particularly of the lower density doped oxides. The higher the density of a doped oxide, the longer it must be annealed to cause its reflow. Therefore, any other process steps which tend to increase the density of the doped oxide should be carried out after, rather than prior to, the present process where possible.

The length of time that the doped oxide should remain at the elevated temperature also depends to a certain extent on the amount of reflow that must take place to give a substantially uniform thickness. Generally, with the low density oxide described above, from about 10 to 15 minutes is sufficient at 1050°C, compared to a time of 45 minutes or more without the water or other source of hydroxyl ions. A high density oxide may require consiberably longer for reflow, but the difference between the time with and without the source of hydroxyl ions is of a comparable magnitude. If carried out for too long a time, particularly with a low density doped oxide containing a relatively high dopant concentration, the oxide will lose its physical stability and actually boil off.

While applicant does not intend to be bound by any particular theory of operation it is believed that the hydroxyl ions operate at lower the viscosity of the doped oxide by combining chemically with the dopant. In the case of the preferred phosphorous dopant, phosphoric acid is apparently formed by reaction of the phosphorous oxide and the hydroxyl ions. An analogous product is formed with the other dopants employed.

The attainment of the foregoing and other objects, features and advantages of the invention should be readily apparent after review of the following more detailed description of the invention and the accompanying drawing.

Figure 1A:
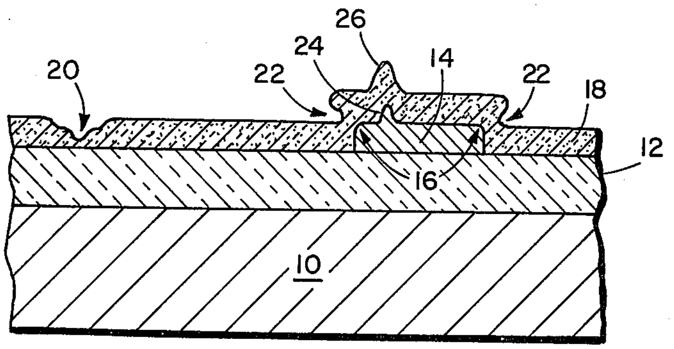
FIGS. 1A, 1B and 1C represent a cross section of an integrated circuit before, during and after practice of the present invention, respectively.

DETAILED DESCRIPTION OF THE INVENTION:

Turning now to the drawing, more particularly to FIG. 1A, there is shown a portion of an integrated circuit prior to practice of the present invention, which illustrates the problems to be overcome with the present process. Single crystal silicon substrate 10 has undoped dielectric layer 12 on its surface and polycrystalline silicon layer 14 over the undoped dielectric layer 12. Steps 16 are formed in layer 14, such as by the conventional photolithographic techniques. A phosphorous doped silicon oxide layer 18 has been formed over the dielectric layer 12 and polycrystalline silicon layer 14, by low temperature pyrolitic deposition at about 400° to 450°C in a conventional manner. As deposited, doped silicon oxide layer 18 contains irregularity 20, and thin regions 22 due to the presence of steps 16. Irregularity 20 is caused by either the presence of a surface condition on polycrystalline silicon film 14 which retards deposition of the doped oxide layer 18 thereon, or by presence of a dust particle or other contaminant which impedes deposition, or causes peaks and nucleation sites, but is removed either during or subsequent to the deposition process. In an extreme case, irregularity 20 in the doped oxide film 18 is severe enough to extend through doped oxide layer 18. A spike 24 is shown in polycrystalline silicon layer 14, which is replicated as protrusion 26 in doped oxide layer 18. Such a protrusion 26 would present a significant problem in later deposition of a metal layer on doped oxide layer 18. If protrusion 26 is sheared off, a short to polycrystalline silicon layer 14 could result.

Figure 1B:
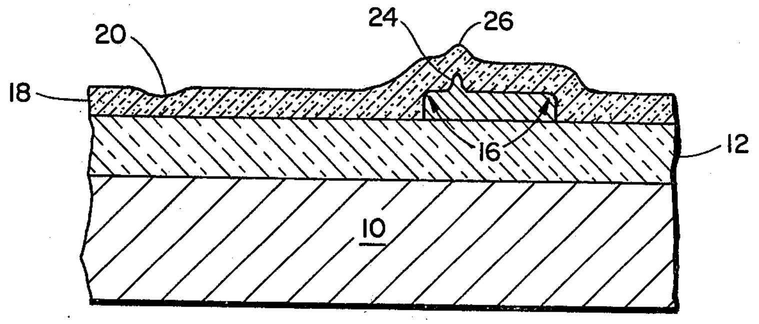

FIG. 1B represents the cross section of FIG. 1A after it has been annealed for, e.g., 5 minutes at 1050°C in the presence of water, either provided as steam to a chamber containing the integrated circuit or formed in situ from oxygen and hydrogen. Irregularity 20 has now disappeared to a substantial extent, and doped oxide film 18 has almost assumed the same thickness in that region as in the rest of its area. The thin regions 22 shown in FIG. 1A have now disappeared, and there is no region of decreased thickness at steps 16. Protrusion 26 overlying polycrystalline silicon spike 24 has been rounded off substantially. To accomplish these results, there has been some flow of doped oxide layer 18 in these areas.

Figure 1C:
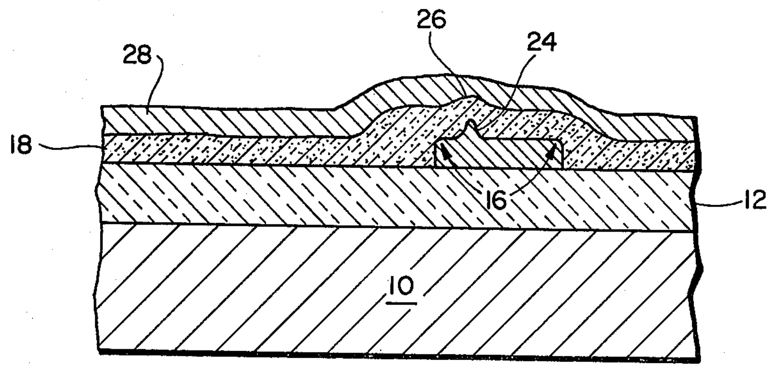

FIG. 1C shows the cross section of FIGS. 1A and 1B after it has been annealed at 1050°C in the presence of steam for e.g., an additional 5 minutes. Irregularity 20 shown in FIGS. 1A and 1B has now completely disappeared. Additional flow of doped oxide layer 18 around steps 16 has taken place. Protrusion 26 in doped oxide layer 18 has virtually disappeared. Doped oxide layer 18 has now assumed a substantially uniform thickness. Metallization layer 28 may now be deposited on doped oxide layer 18 without fear of shorts at steps 16, polycrystalline silicon spike 24, or the location of former irregularity 20.

It should be recognized that it is often not possible to achieve the profile shown in FIG. 1C with prior art processes which would require heating at 1050°C for as long as one hour in a nitrogen or oxygen environment. Heating a partially fabricated integrated circuit at that temperature for that length of time often changes diffusion doping profiles and shapes to an unacceptable extent or modifies other elements of the circuit in an unacceptable manner.

The following nonlimiting examples describe the invention further.

EXAMPLE 1:

An 8000 angstroms thick silicon oxide film doped with phosphorous oxide to give $6 \times 10^{20}$ phosphorous atoms per cubic centimeter, which corresponds to approximately 7–8 weight percent phosphorous, is deposited from silane, oxygen and phosphine dopant at 400°C over a micron thick undoped silicon oxide step on silicon wafer substrates. The film as deposited exhibits thinness at the step and some surface irregularities. The so prepared samples are placed in a 110 mm diameter quartz reaction tube and heated to a temperature of 1050°C with a steam flow rate of 12–20 liters per minute to the reaction furnace. After annealing for 10 minutes under these conditions, examination of the samples by scanning electron micrography shows that the surface irregularities in the doped oxide film have been removed and sufficient flow of the doped oxide has taken place to eliminate the thinness of the doped oxide film at the step.

For comparative purposes, the same procedure is employed, but with substitution of nitrogen at a flow rate of 3,000 cc per minute. In a nitrogen atmosphere, a total annealing time of 45 minutes is required to remove all surface irregularities and eliminate the region of thinness at the steps.

EXAMPLE 2:

The procedure of example 1 is repeated, but with in situ formation of the water by chemical reaction of oxygen and hydrogen. A flow rate of 1500 cc per second oxygen and 3000 cc per second hydrogen to the reaction tube is utilized. Examination of the results by scanning electron micrography shows the same result as in example 1, except that a higher degree of uniformity in the samples is obtained due to better control over the amount of water present.

Substitution of other sources of hydroxyl ions for the water and other dopants for the phosphorous oxide dopant in the above examples gives similar advantageous results.

It should now be apparent that an improved process for reflowing doped oxides in order to achieve substantially uniform thickness of them on a substrate capable of achieving the stated objects of the invention has been provided. By reducing the time required for such a reflow operation by a factor of at least 3 or 4, the effect of the reflow operation on a substrate carrying the doped oxide layer is substantially reduced. This difference in result is of particular value when the reflowing process of this invention is carried out in the fabrication of integrated circuits and other semiconductor devices, since these devices are particularly susceptible to change when heated at elevated temperatures for extended periods of time. While this result makes the invention of particular value in the manufacture of such devices, the substantial reduction of time required for the reflow operation over that required in prior art processes should make the present invention of value in a wide variety of other applications as well.

While the invention has been particularly shown and described in reference to the preferred embodiments thereof, it will be understood by those skilled in the art that changes in form and details may be made therein without departing from the spirit and scope of the invention.

What is claimed is:

1. A process for altering the shape of a doped oxide layer on a substrate, which comprises:

contacting said doped oxide with a source of hydroxyl ions, and heating said doped oxide at least to its softening temperature while in contact with said source of hydroxyl ions, and allowing said doped oxide to reflow until the desired alteration of the layer has taken place.

2. The process of claim 1 in which said source of hydroxyl ions in water.

3. The proces of claim 2 in which the water is formed in situ by reaction of hydrogen and oxygen.

4. The process of claim 2 in which the source of water is steam supplied to a chamber containing said doped oxide.

5. The process of claim 1 in which the dopant for said oxide layer comprises phosphorous, and said oxide layer comprises silicon oxide.

6. The process of claim 5 in which the phosphorous is present in an amount of from about $1 \times 10^{20}$ to $1 \times 10^{21}$ atoms/cm$^3$, as determined by solid state diffusion.

7. The process of claim 5 in which the doped oxide layer is heated to a temperature of from about 1000°C to about 1100°C.

* * * * *

UNITED STATES PATENT AND TRADEMARK OFFICE
CERTIFICATE OF CORRECTION

PATENT NO. : 3,887,733

DATED : June 3, 1975

INVENTOR(S) : Donald L. Tolliver, William E. Armstrong

It is certified that error appears in the above-identified patent and that said Letters Patent are hereby corrected as shown below:

In column 6, line 19 of the above-mentioned patent, change the word "in" to the word "is".

Signed and Sealed this

*twenty-fifth* Day of *November 1975*

[SEAL]

*Attest:*

RUTH C. MASON
*Attesting Officer*

C. MARSHALL DANN
*Commissioner of Patents and Trademarks*